United States Patent
Singh et al.

[19]

[11] Patent Number: 6,031,216
[45] Date of Patent: Feb. 29, 2000

[54] WIRE BONDING METHODS AND APPARATUS FOR HEAT SENSITIVE METALLIZATION USING A THERMALLY INSULATED SUPPORT PORTION

[75] Inventors: Inderjit Singh, San Jose; Seshadri Vikram, Fremont, both of Calif.

[73] Assignee: National Semiconductor Corporation, Santa Clara, Calif.

[21] Appl. No.: 09/098,445

[22] Filed: Jun. 17, 1998

[51] Int. Cl.[7] ................................................ H05B 6/10
[52] U.S. Cl. .......................... 219/633; 219/605; 219/616; 219/243
[58] Field of Search .................... 228/110.1, 111, 228/212, 222, 1.1, 44.7, 46, 4.5, 178–180.5, 200; 219/633, 605, 616, 243

[56] References Cited

U.S. PATENT DOCUMENTS

| | | | |
|---|---|---|---|
| 3,747,198 | 7/1973 | Benson et al. | 219/471.1 |
| 4,434,347 | 2/1984 | Kurtz et al. | 219/56.22 |
| 4,437,604 | 3/1984 | Razon et al. | 229/179 |
| 4,674,671 | 6/1987 | Fister et al. | 228/111 |
| 4,974,767 | 12/1990 | Alfaro et al. | 228/44.7 |
| 5,003,373 | 3/1991 | Tsumura et al. | 357/67 |
| 5,053,595 | 10/1991 | Derbyshire | 219/10.75 |
| 5,186,378 | 2/1993 | Alfaro | 228/110 |
| 5,438,181 | 8/1995 | Volkmann et al. | 219/601 |
| 5,558,267 | 9/1996 | Humphrey et al. | 228/4.5 |
| 5,871,141 | 2/1999 | Hadar et al. | 228/180.5 |
| 5,890,644 | 4/1999 | Ball | 228/44.7 |

Primary Examiner—Teresa Walberg
Assistant Examiner—Shawntina T. Fuqua
Attorney, Agent, or Firm—Beyer & Weaver, LLP

[57] ABSTRACT

A wire bonding apparatus has a first support arrangement for supporting a first integrated circuit package component. A second support arrangement is configured to supporting a second integrated circuit package component. The second support arrangement includes at least a portion of a heating arrangement for heating certain portions of the second component. At least portions of the first support arrangement are thermally insulated from the second support arrangement such that at least certain portions of the first component may be maintained at a temperature substantially lower than the temperature of the heated portions of the second component. The apparatus may be used in method of forming a bonding wire for electrically connecting a first contact on a first integrated circuit package component to a second contact on a second integrated circuit package component. The method includes the steps of supporting and holding the first component and the second component in a desired position. Certain regions of the second component, including the second contact, are heated to a desired temperature while maintaining the temperature of at least certain portions of the first component, including the first contact, at a temperature substantially lower than the heated regions of the second component. A bonding wire is formed that electrically connects the first contact on the first component to the second contact on the second component.

22 Claims, 5 Drawing Sheets

WIRE BONDING METHODS AND APPARATUS FOR HEAT SENSITIVE METALLIZATION USING A THERMALLY INSULATED SUPPORT PORTION

BACKGROUND OF THE INVENTION

The present invention relates generally to wire bonding apparatus and methods used in the manufacture of integrated circuit packages. More specifically, the present invention relates to methods and apparatus used to wire bond an integrated circuit package component such as a die that utilizes heat sensitive contacts such as copper contacts.

The semiconductor industry has been moving continuously toward smaller and faster semiconductor devices with higher transistor density and increasing numbers of input/output connections. These trends have led to the desire to replace the more common aluminum metallization layers within semiconductor devices with copper containing metallization layers. As is well known to those skilled in the art, this use of copper rather than aluminum provides substantial benefits such as higher speed and improved conductivity, and reduces the problems caused by the inductance and capacitance of the features formed in the metallization layer.

Although the use of copper metallization layers in semiconductor devices improves the performance of the device, these devices are difficult to package using conventional wire bonding techniques. This difficulty is mainly due to the fact that, compared to conventional aluminum metallization layers, copper metallization layers oxidize very quickly when exposed to oxygen in the air. This is especially the case when copper is exposed to air at an elevated temperature as is typically required during conventional wire bonding processes.

Wire bonding remains the most common chip interconnecting method for fine pitch semiconductor devices. Gold or aluminum wire is commonly used to connect an input/output terminal pad of the semiconductor die to a lead of a interconnecting substrate such as a leadframe. Typically, a ball bond is used to connect a first end of a bonding wire to the input/output terminal pad while a wedge bond, also called a stitch bond, is used to connect the bonding wire to the lead of the leadframe. Conventional wire bonding apparatus utilize a capillary that is driven by the wire bonding apparatus to form the bonding wire. The capillary is also used for both the ball bonding and the stitch bonding processes.

For illustrative purposes, a conventional wire bonding apparatus 100 that is used to wire bond a conventional integrated circuit die to the leads on a leadframe will be described with reference to FIGS. 1–3. As shown in FIG. 1, wire bonding apparatus 100 includes a heater block 102 for supporting leadframe 104 and an integrated circuit die 106. Die 106 includes a plurality of input/output terminal pads 108 that are to be electrically connected to a plurality of associated leads 110 on leadframe 104 using an array of bonding wires 112 that are formed during the wire bonding process. As shown in FIG. 1, bonding wires 112 are attached to associated input/output terminal pads 108 using a ball bond 114. The other end of each bonding wire 112 is attached to an associated lead 110 using a stitch bond 116.

Leadframe 104 is held in position using a window clamp 118 which mechanically clamps leadframe 104 against heater block 102. Heater block 102 includes a vacuum port 120 having a vacuum cup 122 that is used to securely hold die 106 in place during the wire bonding process. Heater block 102 also includes heating elements 124 that run through heater block 102. As described in more detail hereinafter, heating elements 124 are used to heat heater block 102, and therefore leadframe 104 and die 106, to a desired temperature to aid in the wire bonding process.

Wire bonding apparatus 100 further includes a capillary 126 that has a longitudinally extending wire feed bore 128 that is used to extrude bonding wires 112. To assist in the wire bonding process, wire bonding apparatus 100 is capable of placing a desired downward force on capillary 126 during the process of forming ball bond 114 and stitch bond 116. Apparatus 100 also typically is capable of delivering ultrasonic energy to the bonding region through capillary 126 to enhance the bonding process. As mentioned above, heater block 102 is heated to a desired temperature, typically a temperature greater than about 150 degrees centigrade, to aid in the bonding process.

FIGS. 2A–C briefly illustrate the basic steps involved in forming a bonding wire using capillary 126. FIG. 2A is a close up partial cross sectional view of capillary 126. As illustrated in FIG. 2A, a free air ball 130 of a bonding wire material such as gold or aluminum is formed at a distal end 132 of capillary 126. This is typically accomplished using an electronic flame off mechanism 134 which applies energy to distal end 132 of capillary 126. Once free air ball 130 is formed, it is used to form ball bond 114 on input/output terminal pad 108. FIG. 2B illustrates a close up vertical cross sectional view of capillary 126 as it is being used to form ball bond 114. As mentioned above, a combination of heat, pressure from capillary 126, and ultrasonic energy are used to attach ball bond 114 to pad 108.

Once ball bond 114 is attached to pad 108, bonding wire 112 is extruded through wire feed bore 128. With an appropriate length of bonding wire extruded, bonding wire 112 is stitch bonded to an associated lead 110 on leadframe 104. FIG. 2C illustrates a close up vertical cross sectional view of capillary 126 as it is being used to form stitch bond 116 on lead 110. Again, a combination of heat, pressure, and ultrasonic energy are used to make stitch bond 116.

Traditionally, the above described wire bonding process requires a substantial amount of heat in order to insure good quality bonds at ball bond 114 and stitch bond 116. Typically temperatures of greater than 150 degrees centigrade are required. When utilizing heat sensitive metallization layers such as copper or copper alloys to form the input/output terminal pads 108 on die 106, these relatively high temperatures accelerate the oxidation of the copper pads which can prevent the formation of a good reliable bond between ball bond 114 and pad 108. Therefore, to reduce this problem, it is desirable to develop methods and apparatus capable of forming ball bonds at a reduced temperature.

One approach to reducing the amount of heat required to form ball bonds is described in detail in two copending U.S. Patent Applications, which applications are incorporated herein by reference. These two U.S. patent applications are: Ser. No. 08/784,271, entitled METHOD AND APPARATUS FOR FINE PITCH WIRE BONDING, attorney docket number NS3463/NSC1P087; and Ser. No. 08/890,354, entitled ENCAPSULATED BALL BONDING APPARATUS AND METHOD, attorney docket number NS3681/NSC1P098.

FIG. 3 illustrates a close up partial cross sectional view of a capillary 140 similar to capillary 126 described above. However, capillary 140 includes a specific tip configuration such as that described in detail in the above referenced patent applications. This specific tip configuration, which is referred to as encapsulated ball bonding, allows capillary 140 to be used to form a ball bond 144 without requiring as much heat as is typically required to form reliable ball bonds. In fact, as will be described in more detail hereinafter, applicants have found that the encapsulated ball bonding methods and apparatus may be used to form high quality ball bonds without requiring any substantial heating of the contacts to which the ball bonds are to be attached To summarize the above referenced patent applications, the encapsulated ball bonding apparatus and methods will be briefly described with reference to FIG. 3. As shown in FIG. 3, capillary 140 has a longitudinally extending wire feed bore 141 that is used to extrude bonding wires 112. Capillary 140 also has a cavity 142 formed into its tip. Cavity 142 has a cavity diameter 143 and is shaped and sized such that cavity 142 substantially encapsulates and is capable of molding a ball bond 144. Among other things, this configuration allows capillary of this design to deliver ultrasonic energy to ball bonds more effectively than conventional tip configurations. Because of this, reliable ball bonds may be formed without requiring any substantial heating of the input/output terminal pads to which the ball bonds are to be attached.

In a specific example, a number of experiments have been successfully performed using a model 3006FPX wire bonding machine available from ESEC. Using such a machine and a capillary having a 1.0 mil gold bonding wire and a cavity diameter of about 1.6 mil, bonding times on the order of 15 milliseconds at 14% power worked well. In the experiment, the bonding temperature was about 120 degrees centigrade and the bonding force exerted downward on the ball bond during the bonding process was about 100 mN. Of course, the settings used for various applications may be widely varied.

Because the above described encapsulated ball bonding approach does not require heating of the contact to which the ball bond is to be attached, this approach is well suited to ball bonding on heat sensitive metallization layers such as cooper or copper alloys. By eliminating the need to heat the contact to which the ball bond is to be attached, the amount of oxidation that occurs during the overall bonding process may be substantially reduced. However, although the encapsulated ball bonding approach works well to produce a ball bond without requiring any substantial heating, this is not the case for forming good quality stitch bonds. In the case of stitch bonds, the encapsulated ball bonding approach still appears to require the heating of the lead to which the stitch bond is to be attached in order to provide reliable connections.

To date, wire bonding is one of the most cost effective and popular packaging methods of packaging integrated circuit die. Because of the popularity of this packaging approach, conventional wire bonding equipment is readily available. Accordingly, it is desirable to provide methods and apparatus that will allow conventional wire bonding apparatus to be modified so that integrated circuit packages using heat sensitive metallization layers such as copper or copper alloy may be reliably assembled. The present invention provides improved wire bonding methods and wire bonding apparatus that substantially reduce the oxidation problem associated with the use of higher performance heat sensitive metallization layers such as copper and copper alloys. This allows integrated circuit packages using the higher performance materials to be reliably assembled using cost effective wire bonding methods and apparatus in accordance with the invention.

SUMMARY OF THE INVENTION

As will be described in more detail hereinafter, a method of forming a bonding wire for electrically connecting a first contact on a first integrated circuit package component to a second contact on a second integrated circuit package component is disclosed herein. The method includes the step of supporting and holding the first component and the second component in a desired position. Certain regions of the second component, including the second contact, are heated to a desired temperature while maintaining the temperature of at least certain portions of the first component, including the first contact, at a temperature substantially lower than the heated regions of the second component. A bonding wire is formed that electrically connects the first contact on the first component to the second contact on the second component.

In one embodiment, the first component is an integrated circuit die, the first contact is a heat sensitive metal input/output terminal pad on the die, the second component is a leadframe, and the second contact is a contact pad located on an electrically conductive lead of the leadframe. The step of forming the bonding wire includes the steps of using a capillary driven by a wire bonding machine to form a ball bond attached to the first contact of the first component. The capillary has a recessed tip that defines a cavity. The cavity is sized and shaped such that it is able to substantially encapsulate and mold the ball bond into a desired ball bond shape during the step of using the capillary to form the ball bond on the first contact of the first component. The capillary is also used to form a bonding wire extending from the ball bond and to stitch bond the bonding wire to the second contact of the second component.

In one version of this embodiment, the first contact on the first component is a copper contact and the step of forming a ball bond on the first contact includes the step of using ultrasonic energy to attach the ball bond to the first contact on the first component. Preferably, the step of forming the ball bond includes the step of forming the ball bond at a temperature of less than about 110 degrees centigrade. In some cases, the step of forming the ball bond includes the step of forming the ball bond attached to the first contact using substantially only ultrasonic energy without substantially heating the capillary or first contact in order to assist in the formation and attachment of the ball bond to the first contact.

In another embodiment, the step of supporting and holding the first and second component includes the step of supporting the first and second component on a heater block. The heater block includes a first portion for supporting the first component and a second portion that is thermally insulated from the first portion for supporting the second component, the second portion of the heater block including at least a portion of a heating arrangement for heating the second portion of the heater block. In one version of this embodiment, the heating arrangement includes a heating element formed into the heater block. In this version, the step of heating certain portions of the second component includes the step of using the heating element to heat the second portion of the heater block on which the second component is supported thereby heating certain portions of the second component. Alternatively, in another version, the heating arrangement includes a primary coil and a secondary coil. In this case, the step of heating certain portions of the second component includes the step of using the primary and secondary coils to inductively heat the certain portions of the second component.

In another embodiment, the step of supporting and holding the first and second component includes the step of using a window clamp to hold the second component in position on the heater block. The window clamp has an opening formed into the window clamp for allowing access to the first and second contacts during the step of forming the bonding wire. The window clamp also includes an arrangement for directing a flow of gas over the first component during the step of forming the bonding wire. The method further includes the step of directing a flow of inert cooling gas over the first component during the step of forming the bonding wire.

In one embodiment, the heating step includes the step of heating the certain regions of the second component to a temperature greater than about 150 degrees centigrade while maintaining the temperature of at least certain portions of the first component at a temperature less than about 110 degrees centigrade.

A wire bonding apparatus is also disclosed. The apparatus includes a first support arrangement for supporting a first integrated circuit package component. The apparatus also includes a second support arrangement for supporting a second integrated circuit package component. The second support arrangement includes at least a portion of a heating arrangement for heating certain portions of the second component. At least portions of the first support arrangement are thermally insulated from the second support arrangement such that at least certain portions of the first component may be maintained at a temperature substantially lower than the temperature of the heated portions of the second component.

The wire bonding apparatus may further include a window clamp for holding the second component in position on the second support arrangement. The window clamp has an opening formed into the window clamp for allowing access to portions of the first and second components during a wire bonding process. The window clamp also has an arrangement for directing a flow of a cooling gas over the first component during the wire bonding process. This allows portions of the second component to be heated to a desired temperature while maintaining the temperature of portions of the first component at a temperature substantially lower than the heated portions of the second component.

In one embodiment of the apparatus, the first support arrangement and the second support arrangement are formed as part of a heater block. The heater block has a first and a second portion. The second portion includes at least a part of a heating arrangement for heating at least certain parts of the second portion of the heater block. The first portion of the heater block is thermally insulated from the second portion such that the second portion of the heater block may be heated to a desired temperature while maintaining the temperature of the first portion of the heater block at a temperature substantially lower than the temperature of the second portion of the heater block. In one embodiment, the first portion of the heater block is thermally insulated from the second portion of the heater block by an air gap located between the first and second portions of the heater block.

The second portion of the heater block may be configured to support a leadframe of an integrated circuit package and the first portion of the heater block may be configured to support an integrated circuit die. This configuration allows at least certain regions of the leadframe to be heated to a desired temperature while maintaining the temperature of the die at a temperature substantially lower than the heated regions of the leadframe.

The heating arrangement may include a heating element formed into the second portion of the heater block. Alternatively, the heating arrangement may include a primary coil and a secondary coil with one of the coils being formed into the second portion of the heater block. With this arrangement, the primary and secondary coils are used to inductively heat at least certain parts of the second portion of the heater block.

In a preferred embodiment, the heating arrangement is configured to heat at least a part of the second portion of the heater block to a temperature greater than about 150 degrees centigrade. Also, the first portion of the heater block is thermally insulated from the second portion of the heater block such that the first portion of the heater block may be maintained at a temperature of less than about 110 degrees centigrade.

A heating arrangement for use in a wire bonding apparatus is also disclosed. The heating arrangement includes a primary coil and a secondary coil. The secondary coil has a portion of the secondary coil positioned in close proximity to at least a portion of the primary coil. An A/C power source is electrically connected to the primary coil for driving the primary coil such that the primary coil and secondary coil interact to inductively heat certain materials that may be positioned between the primary and secondary coils.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION OF THE PREFERRED EMBODIMENTS

In the following detailed description of the present invention, several specific embodiments are set forth in order to provide a thorough understanding of the invention. However, as will be apparent to those skilled in the art, the present invention may be practiced without these specific details or by using alternative elements or processes. In other instances, well known processes, procedures, components, and circuits have not been described in detail so as not to unnecessarily obscure aspects of the present invention.

Figure 4:
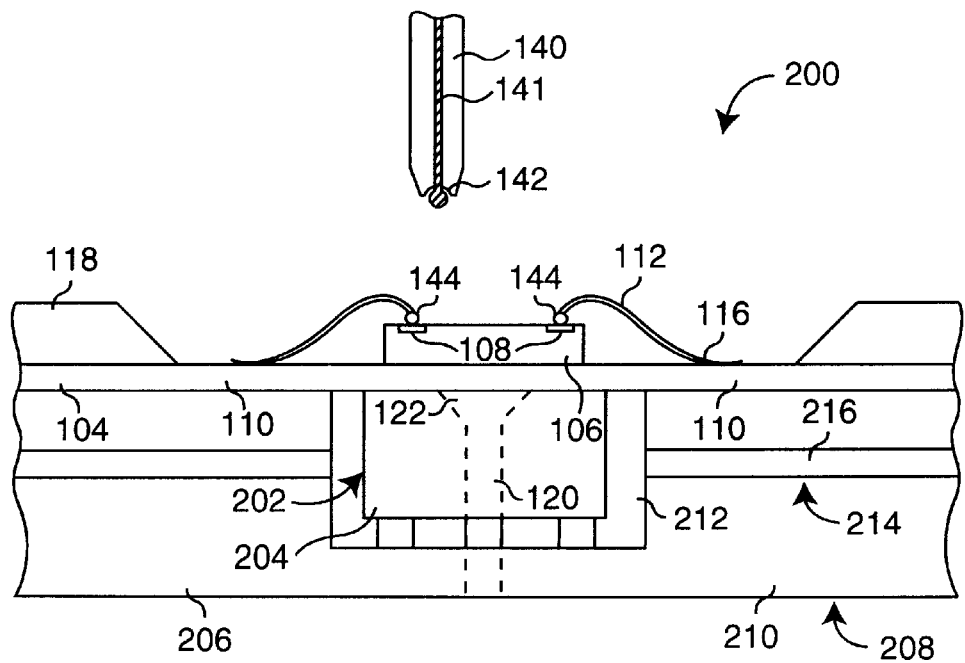
FIG. 4 is a diagrammatic vertical cross section of portions of a first embodiment of a wire bonding apparatus in accordance with the invention illustrating a wire bonding process in accordance with the invention that uses a capillary to form bonding wires that interconnect components of the integrated circuit package.

Referring initially to FIG. 4, a wire bonding apparatus 200 designed in accordance with the invention will be described. For illustrative purposes, an example of a system similar to that described above in the background will be described. As shown in FIG. 4 and in accordance with the invention, wire bonding apparatus 200 includes a first support arrangement 202 for supporting a first integrated circuit package component. In this example, the first integrated circuit package component takes the form of integrated circuit die 106 as described for FIG. 1 and first support arrangement 202 takes the form of a first portion 204 of a heater block 206. Apparatus 200 also includes a second support arrangement 208 for supporting a second integrated circuit package component. In this case the second integrated circuit package component is leadframe 104 as described for FIG. 1 and second support arrangement 208 is a second portion 210 of the heater block 206.

Although the first and second integrated circuit package components are described in this example as being a die and a leadframe, it should be understood that this is not a requirement of the invention. Instead, these components may be any desired integrated circuit package components that are to be interconnected using a bonding wire. For example, they may be two die that are to be interconnected using bonding wires. Also, although support arrangements 202 and 208 have been described as first and second portions 204 and 210 of a heater block 206, it should be understood that other support arrangements would also fall within the scope of the invention.

In accordance with the invention, first portion 204 and second portion 210 of heater block 206 are thermally insulated from one another. In the example shown in FIG. 4, this thermal insulation is provided by an air space 212 between the first portion 204 and second portion 210. Alternatively, solid insulating material or any other suitable and readily providable insulating arrangement may be utilized to thermally insulate the first and second portions of the heater block and still remain within the scope of the invention. The thermally insulated first portion of the heater block is sometimes referred to herein as a "floating pedestal" since it supports and thermally insulates a portion of the component being wire bonded during wire bonding.

Apparatus 200 also includes a heating arrangement 214 for heating at least portions of second portion 210 of heater block 206. This heating arrangement may be any suitable and readily providable heating arrangement. In the example shown in FIG. 4, heating arrangement 214 includes a heating element 216. Heating element 216 runs through heater block 206 such that it is capable of heating second portion 210 of heater block 206 and therefore capable of heating certain portions of leadframe 104 including leads 110. However, since first portion 204 of heater block 206 is thermally insulated from second portion 210 by air space 212, heating element 216 does not substantially heat first portion 204. Also, since die 106 is supported by first portion 204 of heater block 206, die 106 is not substantially heated by heating element 216. Therefore, in accordance with the present invention, the above described configuration of apparatus 200 allows certain portions of leadframe 104 including leads 110 to be heated to a desired temperature while maintaining die 106 at a temperature substantially lower than the heated portions of leadframe 104.

Figure 1:
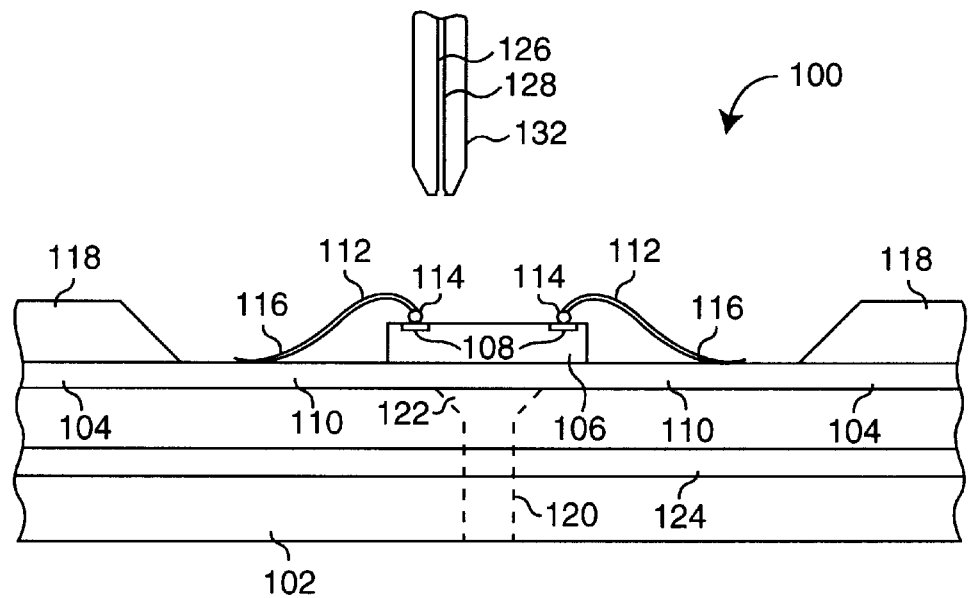
FIG. 1 is a diagrammatic vertical cross section of portions of a wire bonding apparatus illustrating a prior art wire bonding process that uses a capillary to form bonding wires that interconnect a die and a leadframe.
Figure 3:
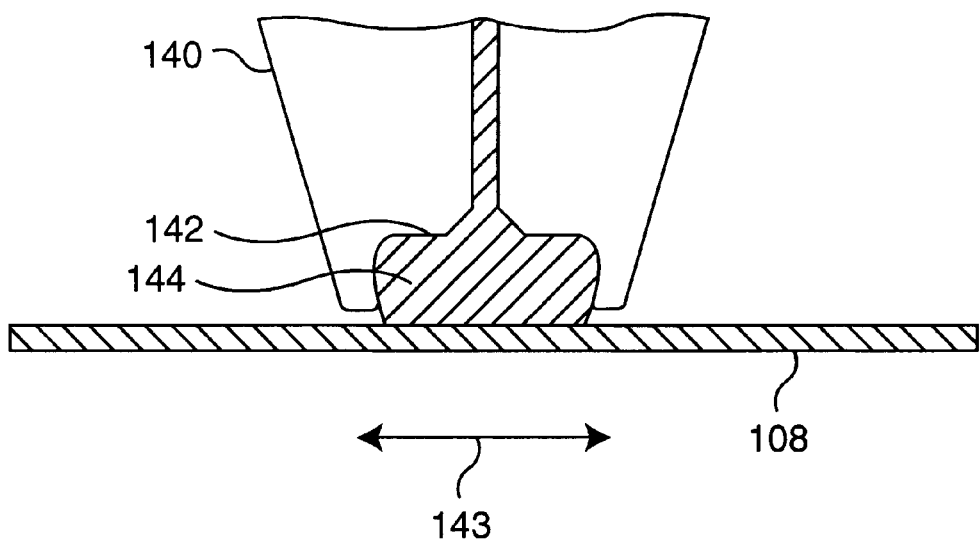
FIG. 3 is a diagrammatic vertical partial cross section of another embodiment of an improved prior art capillary illustrating how the capillary is used to form a ball bond.

As describe above for FIG. 1, die 106 includes input/output terminal pads 108 that are to be electrically connected to associated leads 110 on leadframe 104 using bonding wires 112. For the example illustrated in FIG. 4, bonding wires 112 are formed during the wire bonding process using encapsulated capillary 140 as described above for FIG. 3. Bonding wires 112 are attached to associated input/output terminal pads 108 using a ball bond 144. The other end of each bonding wire 112 is attached to an associated lead 110 using a stitch bond 116.

In a similar manner to that described above for FIG. 1, leadframe 104 is held in position using a window clamp 118 which mechanically clamps leadframe 104 against heater block 206. As also described above for heater block 102, heater block 206 includes vacuum port 120 having vacuum cup 122 that is used to securely hold die 106 in place during the wire bonding process. Wire bonding apparatus 200 further includes capillary 140 that has longitudinally extending wire feed bore 141 that is used to extrude bonding wires 112. To assist in the wire bonding process, wire bonding apparatus 200 is capable of placing a desired downward force on capillary 140 during the process of forming ball bond 144 and stitch bond 116. Apparatus 200 also is capable of delivering ultrasonic energy to the bonding region through capillary 140 to enhance the bonding process.

Figure 5:
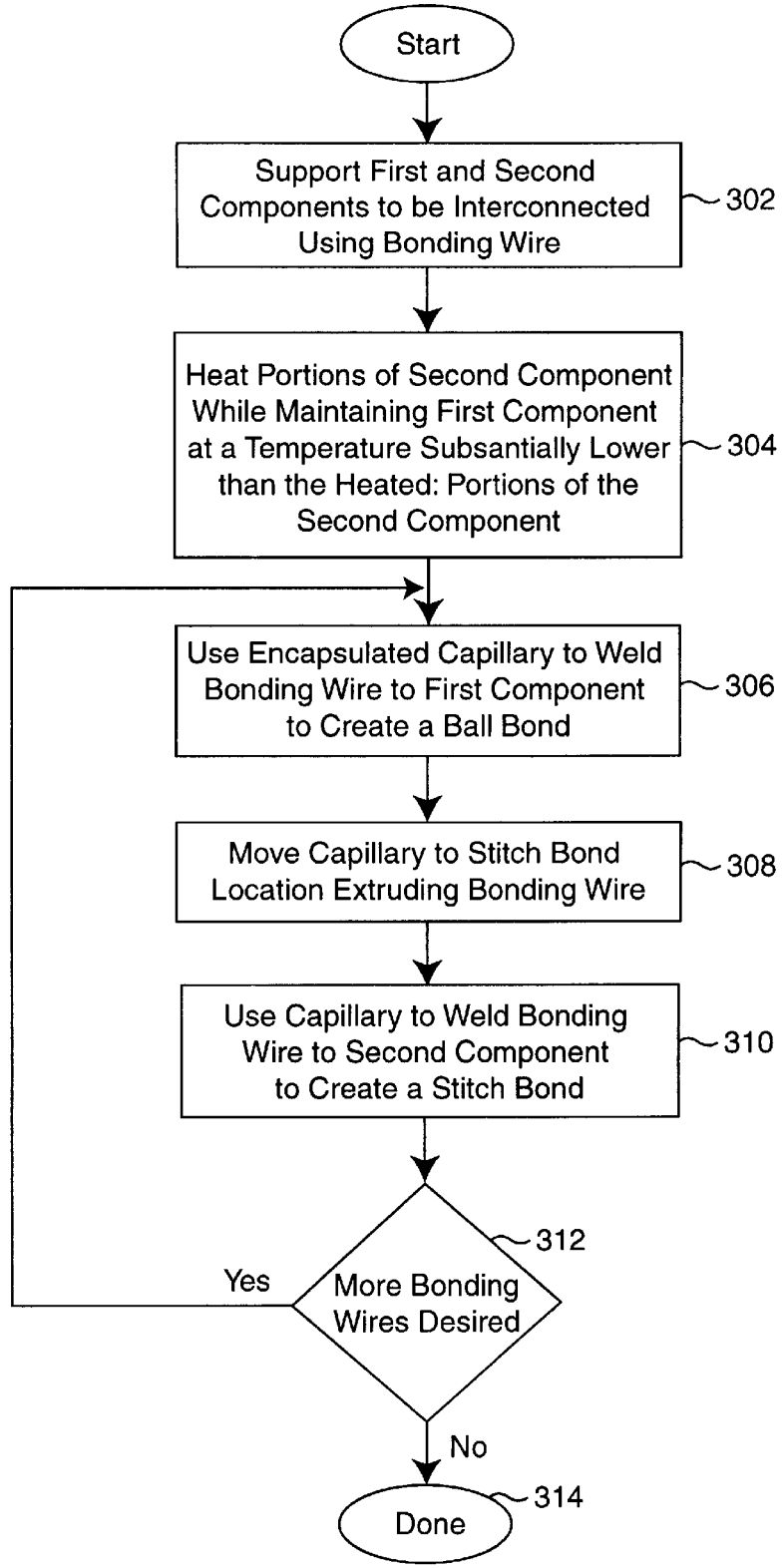
FIG. 5 is a flow chart illustrating a method of ball bonding in accordance with one embodiment of the present invention.

Now that the basic configuration of wire bonding apparatus 200 has been described, the process of forming bonding wires in accordance with the invention using such an apparatus will be described with reference to the flow chart of FIG. 5. FIG. 5 illustrates the basic steps involved in forming a bonding wire using apparatus 200 of FIG. 4. As indicated by block 302, the process starts by supporting a first and a second integrated circuit package component in a desired position. As described above, these components include associated contacts that are to be interconnected using bonding wires formed by apparatus 200.

Initially, in accordance with the method of the present invention, certain portions of the second integrated circuit package component, for example portions of a leadframe, are heated to a desired temperature. This temperature is a temperature that is sufficient to assure that a good quality stitch bond may be made on the contact of the second component. Typically this temperature would be greater than about 150 degrees centigrade. Although the specific temperature of 150 degrees centigrade is given as an example, it should be understood that this temperature is not a requirement of the invention.

As described above, the first integrated circuit package component, for example a die including copper metal input/output terminal pads, is maintained at a temperature substantially lower than the temperature of the heated portions of the second integrated circuit package component. This is accomplished by using an apparatus in accordance with the invention that thermally insulates the first portion of the heater block from the second portion of the heater block. In a specific example, the die and the copper input/output terminal pads are maintained at a temperature of less than about 110 degrees centigrade. In other embodiments, the die and the input/output terminal pads may be maintained at a temperature near ambient temperatures. Again, although specific temperatures have been given as an example, it is to be understood that the present invention would equally apply regardless of the specific temperatures used so long as there is a substantial temperature differential between the temperature of the contacts of the second component and the contacts of the first component.

Figure 2A:
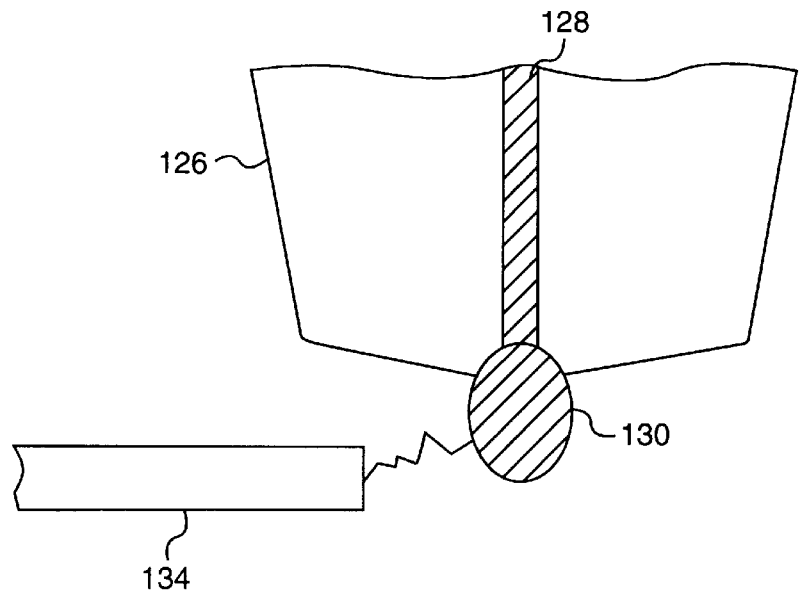
FIG. 2A is a diagrammatic vertical partial cross section of the capillary of FIG. 1 illustrating how the capillary is used to form a free air ball of bonding wire material.
Figure 2B:
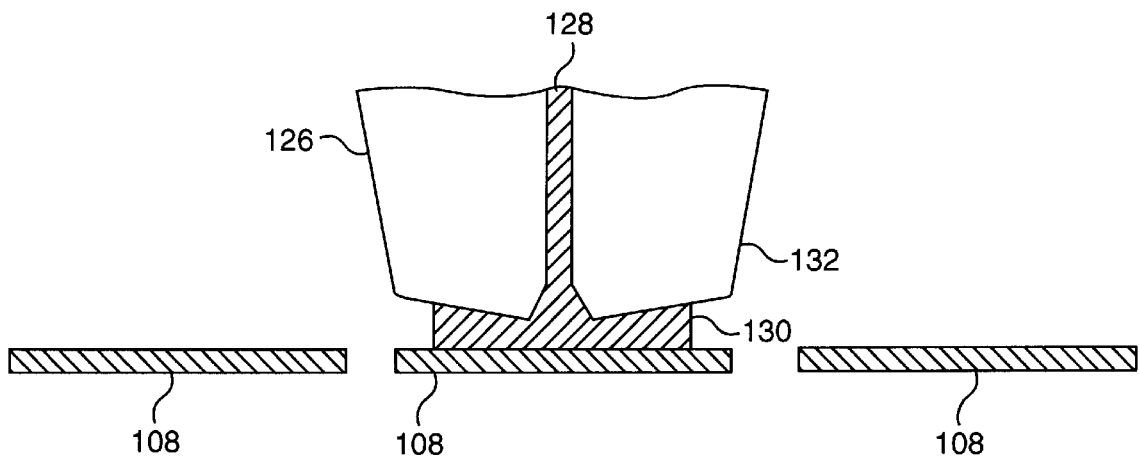
FIG. 2B is a diagrammatic vertical partial cross section of the capillary of FIG. 1 illustrating how the capillary is used to form a ball bond.

Once the components are heated to their desired temperatures, the wire bonding process is performed as indicated by blocks 306, 308, 310 and 312 of FIG. 5. Initially, a free air ball of a bonding wire material such as gold is formed at the distal end of capillary 140 as described earlier for FIG. 2A. This is typically accomplished using an electronic flame off mechanism which applies energy to the distal end of the capillary. Once the free air ball is formed, it is used to form ball bond 144 on input/output terminal pad 108 as described above for FIG. 3. As mentioned above, because encapsulated capillary 140 is used to form ball bond 144, the temperature required for forming this bond is substantially reduced. In fact, applicants have found that the proper combination of pressure from capillary 140 and ultrasonic energy may be used to attach ball bond 144 to pad 108 without requiring pad 108 to be heated.

Figure 2C:
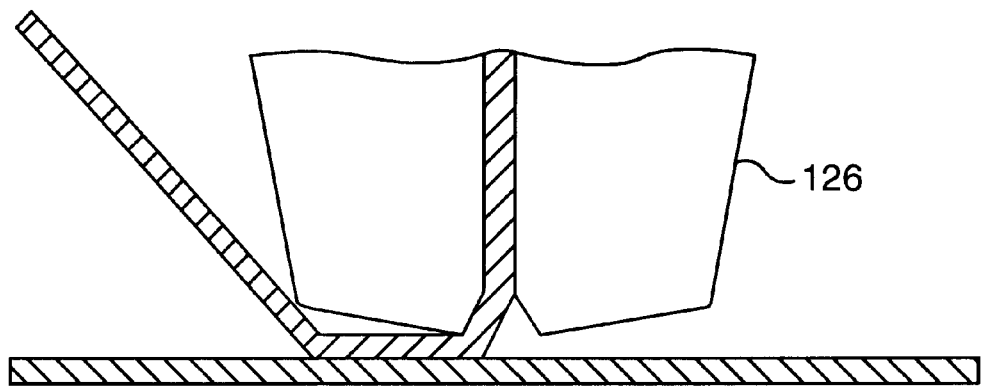
FIG. 2C is a diagrammatic vertical partial cross section of the capillary of FIG. 1 illustrating how the capillary is used to form a stitch bond.

Once ball bond 144 is attached to pad 108, bonding wire 112 is extruded through wire feed bore 141 as indicated in block 308 of FIG. 5. With an appropriate length of bonding wire extruded, bonding wire 112 is stitch bonded to an associated lead 110 on leadframe 104 as indicated by block 310 of FIG. 5. This procedure is illustrated in FIG. 2C. As described above, stitch bond 116 requires a combination of heat, pressure, and ultrasonic energy to form a reliable stitch bond 116. Since, leads 110 of leadframe 102 are heated to a desired temperature as indicated in block 304 of FIG. 5, this approach to wire bonding is able to produce reliable stitch bonds on leads 110. As indicated in block 312, steps 306, 308, and 310 are repeated until all of the desired bonding wires are formed interconnecting die 106 to leadframe 104.

Because copper input/output terminal pad 108 is maintained at a temperature substantially lower than the temperature of leads 110, the amount of oxidation of copper pad 108 is substantially reduced. By reducing the oxidation levels, more reliable ball bonds are produced compared to those that would be possible if copper pads 108 were heated to the same temperatures as leads 110 as is the case in conventional wire bonding processes.

Figure 6:
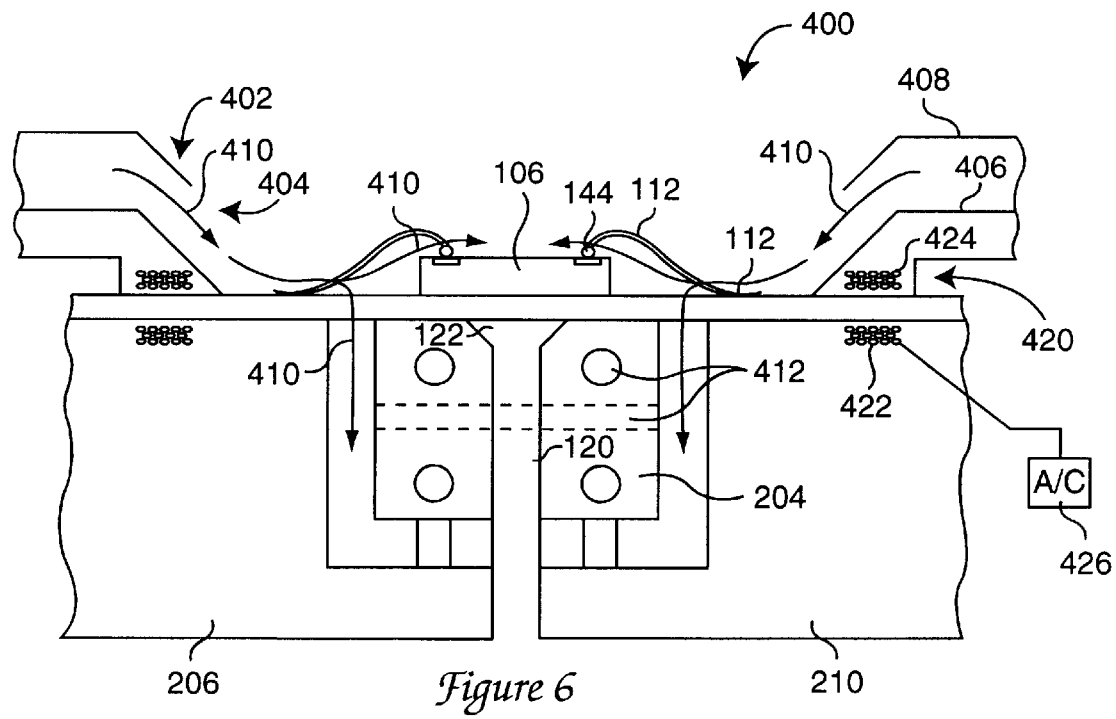
FIG. 6 is a diagrammatic vertical cross section of portions of a second embodiment of a wire bonding apparatus in accordance with the invention.

Referring now to FIG. 6, several alternative configurations for a wire bonding apparatus 400 in accordance with the invention will be described. FIG. 6 illustrates another embodiment of the invention that incorporates a novel window clamp arrangement 402 that aids in maintaining die 106 at a temperature substantially lower than the heated portions of leadframe 104. As described above for apparatus 200, apparatus 400 includes a heater block 206 having a first portion 204 that is thermally insulated from second portion 210. However, in this embodiment window clamp arrangement 402 includes a gas directing arrangement 404 for directing a flow of gas over die 106.

In the embodiment shown in FIG. 6, gas directing arrangement 404 includes a lower plate 406 and an upper plate 408. Lower plate 406 functions in a manner similar to a conventional window clamp such as window clamp 118 described above. That is, the primary purpose of lower plate 406 is to hold leadframe 104 in place. Upper plate 408 provides a completely separate function. As shown in FIG. 6, upper plate 408 is configured to direct a flow of gas 410 over die 106 and around the first portion 204 of heater block 206 as indicated by arrows 410. This flow of gas is able to provide two different functions.

The first function provided by window clamp arrangement 402 is that gas 410 acts as a coolant to assist in maintaining the first portion 204 of heater block 206 and die 106 at a temperature substantially lower than the temperature of the heated portions 210 of heater block 206. To further assist in this cooling effect, first portion 204 of heater block 206 may include a plurality of openings 412 formed into first portion 204. These openings increase the surface area of first portion 204 which improves the cooling effect of gas 410. That is, the openings 412 form channels in the pedestal 204 through which the cooling gas 410 may pass to better cool the pedestal relative to the second portion 210 of the heater block 206.

In the second function, gas 410 may be an inert gas such as nitrogen. Since gas 410 is directed over die 106 as indicated in FIG. 6, this flow of inert gas over die 106 and pads 108 creates a localized region of inert gas surrounding die 106 that has a substantially reduced concentration of oxygen. By increasing the concentration of inert nitrogen gas and reducing the concentration of oxygen in the localized region surrounding die 106, the amount of oxidation that may occur on pads 108 is further reduced.

Although second portion 210 of heater block 206 has been described as including a heating element, this is not a requirement. Instead, any suitable arrangement for heating second portion 210 may by utilized. FIG. 6 illustrates an alternative embodiment of a heating arrangement 420 that uses inductive heating to heat lead 110 of leadframe 104. In this embodiment, second portion 210 of heater block 206 includes at least portions of a primary coil 422. Additionally, lower plate 406 of window clamp arrangement 402 includes at least portions of a secondary coil 424 that is positioned in close proximity to portions of primary coil 422. In this embodiment, primary coil 422 is driven by a suitable and readily providable A/C power source 426 in a way that causes primary coil 422 and secondary coil 424 to interact, thereby inductively heating leads 110 of leadframe 104. This inductive heating approach allows for very localized heating of leads 110 and improves the efficiency of the overall wire bonding apparatus 400.

Figure 7:
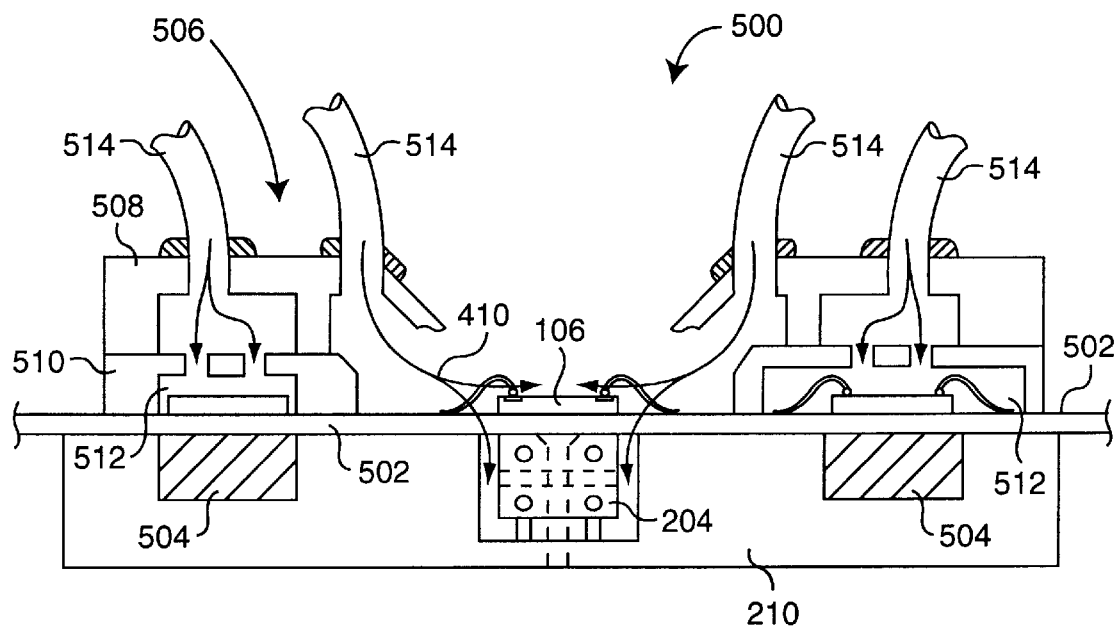
FIG. 7 is a diagrammatic vertical cross section of portions of a third embodiment of a wire bonding apparatus in accordance with the invention.

Referring now to FIG. 7, one final embodiment of a wire bonding apparatus 500 designed in accordance with the invention will be described. In this embodiment, apparatus 500 is designed to operate on leadframes that are arranged in a strip or magazine 502. That is, multiple leadframes 104 are formed within a single strip or sheet 502 of substrate material.

As shown in FIG. 7, apparatus 500 includes heater block 206 having first and second portions 204 and 210 as described above. However, in this embodiment, heater block 206 includes additional thermally insulating regions 504. Insulating regions 504 are located in heater block 206 such that, as leadframe strip or magazine 502 is advanced as each die 106 completes the wire bonding procedure, that die advances to a location above one of insulating regions 504. Also, each die is positioned over another insulating region 504 prior to being positioned over the first portion 204 of heater block 206. This successive positioning of the die over thermally insulated regions prevents the heating of the die as it is queued to the wire bonding position on apparatus 500.

Apparatus 500 also includes a window clamp arrangement 506 similar to that described above for window clamp arrangement 402. That is window claim arrangement 506 includes a lower plate 508 and upper plate 510. However, in this embodiment, lower plate 508 and upper plate 510 cooperate to form openings 512 above insulating regions 504. These openings 512 allow inert gas 410 to flow over die 106 as die 106 are awaiting the wire bonding process and after die 106 have completed the wire binding process. In this embodiment, a plurality of feed hoses 514 are used to supply gas 410 to apparatus 500.

Although window clamp arrangement 506 has been described as including a lower plate and an upper plate, this is not a requirement of the invention. Instead, any suitable clamping arrangement may be utilized and any suitable arrangement for directing a flow of gas over the die may be utilized. Any of these various combinations of clamping and gas feed arrangements would equally fall within the scope of the present invention.

Although only a few specific embodiments of a wire bonding apparatus and methods of using the apparatus in accordance with the invention have been described in detail, it should be understood that the apparatus of the invention may take on a wide variety of different configurations that may be used in a wide variety of specific methods of the present invention. All of these various apparatus and methods would equally fall within the scope of the invention so long as the heat sensitive metallization contacts of the first integrated circuit package component are maintained at a temperature substantially lower than the temperature of the heated portions of the second integrated circuit package component. Also, although only a few specific embodiments of methods of the invention have been described, it is to be understood that the methods of the present invention may be embodied in a wide variety of alternative forms and still remain within the scope of the invention. Any of these various embodiments would equally fall within the scope of the invention so long as the temperature differential is maintained between the ball bond contact and the stitch bond contact.

Although only certain conventional integrated circuit package components have been described as being used with the novel method of the invention, it should be understood that the present invention may take on a wide variety of specific configurations using a variety of other conventional components and still remain within the scope of the present invention. Therefore, the present examples are to be considered as illustrative and not restrictive, and the invention is not to be limited to the details given herein, but may be modified within the scope of the appended claims.

What is claimed is:

1. A method of forming a bonding wire for electrically connecting a first contact of a first integrated circuit package component to a second contact of a second integrated circuit package component, the method comprising:

supporting and holding the first integrated circuit package component and the second integrated package circuit component in a desired position;

heating at least one region of the second integrated circuit package component, including the second contact, to a first temperature while maintaining at least one portion of the first integrated circuit package component, including the first contact, at a second temperature that is substantially lower than the first temperature; and forming a bonding wire that electrically connects the first contact of the first integrated circuit package component to the second contact of the second integrated circuit package component.

2. A method according to claim 1 wherein the first component is an integrated circuit die, the first contact is a heat sensitive metal input/output terminal pad on the die, the second component is a leadframe, and the second contact is a contact pad located on an electrically conductive lead of the leadframe.

3. A method according to claim 1 wherein the forming of the bonding wire further comprises:

using a capillary driven by a wire bonding machine to form a ball bond attached to the first contact of the first component, the capillary having a recessed tip that defines a cavity, the cavity being sized and shaped such that it is able to substantially encapsulate and mold the ball bond into a desired ball bond shape during the step of using the capillary to form the ball bond on the first contact of the first component;

using the capillary to form a bonding wire extending from the ball bond; and using the capillary to stitch bond the bonding wire to the second contact of the second component.

4. A method according to claim 3 wherein the first contact of the first integrated circuit package component is a copper contact and the forming of the ball bond on the first contact includes using ultrasonic energy to attach the ball bond to the first contact of the first component.

5. A method according to claim 4 wherein the ball bond is formed at a temperature of less than about 110 degrees centigrade.

6. A method according to claim 4 wherein the forming of the ball bond includes forming the ball bond attached to the first contact using substantially only ultrasonic energy without substantially heating the capillary or first contact in order to assist in the formation and attachment of the ball bond to the first contact.

7. A method according to claim 1 wherein the supporting and holding of the first and second integrated circuit package components include supporting the first and second components on a heater block, the heater block including a first portion for supporting the first component and a second portion that is thermally insulated from the first portion for supporting the second component, the second portion of the heater block including at least a portion of a heating arrangement for heating at least a region of the second portion of the heater block.

8. A method according to claim 7 wherein the heating arrangement includes a heating element formed into the heater block and wherein the heating element is used to heat the second portion of the heater block on which the second component is supported thereby heating certain portions of the second component.

9. A method according to claim 7 wherein the heating arrangement includes a primary coil and a secondary coil and wherein the heating of the at least one portion of the second component includes using the primary and secondary coils to inductively heat the at least one portion of the second component.

10. A method according to claim 7 wherein the supporting and holding of the first and second integrated circuit package components include using a window clamp to hold the second component in position on the heater block, the window clamp having an opening formed into the window clamp for allowing access to the first and second contacts during the forming of the bonding wire, the window clamp also including an arrangement for directing flow of a gas over the first component during the forming of the bonding wire, the method further including directing a flow of inert cooling gas over the first component during the forming of the bonding wire.

11. A method according to claim 1 wherein the at least one region of the second component is heated to a temperature greater than about 150 degrees centigrade while the temperature of the at least one portion of the first component is maintained at a temperature less than about 110 degrees centigrade.

12. A method according to claim 1 wherein the heating of the at least one region of the second integrated circuit package component further comprises:

positioning at least a portion of a primary coil adjacent to the region of the second component that is to be heated;

relative to the primary coil, positioning at least a portion of a secondary coil adjacent to an opposite side of the region of the second component that is to be heated;

electrically driving the primary coil in a way which causes the primary coil and the secondary coil to interact thereby inductively heating the region of the second component located between the primary and secondary coils.

13. A method according to claim 1 wherein maintaining the temperature of the at least one portion of the first component at a temperature substantially lower than the at least one heated region of the second component includes directing flow of an inert cooling gas over at least one portion of the first component.

14. A wire bonding apparatus suitable for use in packaging of integrated circuits, the wire bonding apparatus comprising:

a first support arrangement for supporting a first integrated circuit package component; and a second support arrangement for supporting a second integrated circuit package component, the second support arrangement including at least a portion of a heating arrangement for heating at least one portion of the second component, at least a portion of the first support arrangement being thermally insulated from the second support arrangement such that at least a portion of the first integrated circuit component is capable of being maintained at a temperature substantially lower than the temperature of the at least one heated portion of the second integrated circuit package component.

15. A wire bonding apparatus according to claim 14 wherein the first support arrangement and the second support arrangement are formed as parts of a heater block, the heater block having a first and a second portion, the second portion including at least a part of a heating arrangement for heating at least one part of the second portion of the heater block, and wherein at least one part of the first portion of the heater block is thermally insulated from the second portion such that the second portion of the heater block is capable of being heated to a desired temperature while maintaining the first portion of the heater block at a temperature substantially lower than the temperature of the second portion of the heater block.

16. A wire bonding apparatus according to claim 15 wherein the second portion of the heater block is configured to support a leadframe of an integrated circuit package and the first portion of the heater block is configured to support an integrated circuit die, this configuration allowing at least certain regions of the leadframe to be heated to a desired temperature while maintaining the temperature of the die at a temperature substantially lower than the heated regions of the leadframe.

17. A wire bonding apparatus according to claim 15 wherein the first portion of the heater block is thermally insulated from the second portion of the heater block by an air gap located between the first and second portions of the heater block.

18. A wire bonding apparatus according to claim 15 wherein the heating arrangement includes a heating element formed into the second portion of the heater block.

19. A wire bonding apparatus according to claim 15 wherein the heating arrangement includes a primary coil and a secondary coil with one of the coils being formed into the second portion of the heater block, the primary and secondary coils being used to inductively heat at least certain parts of the second portion of the heater block.

20. A wire bonding apparatus according to claim 15 wherein the heating arrangement is configured to heat the at least one part of the second portion of the heater block to a temperature greater than about 150 degrees centigrade and wherein the first portion of the heater block is thermally insulated from the second portion of the heater block such that at least a part of the first portion of the heater block is capable of being maintained at a temperature of less than about 110 degrees centigrade.

21. A wire bonding apparatus according to claim 14 wherein the apparatus further includes a window clamp for holding the second component in position on the second support arrangement, the window clamp having an opening formed into the window clamp for allowing access to at least one portion of the first and second components during a wire bonding process, the window clamp also having an arrangement for directing flow of a cooling gas over the first component during the wire bonding process such that the second component is capable of being heated to a desired temperature while maintaining the temperature of portions of the first component at a temperature substantially lower than the heated portions of the second component.

22. A wire bonding apparatus suitable for use in packaging of integrated circuits, the wire bonding apparatus comprising:

a first support arrangement for supporting a first integrated circuit package component;

a second support arrangement for supporting a second integrated circuit package component, the second support arrangement including at least a portion of a heating arrangement for heating at least one portion of the second component; and wherein at least a portion of the first support arrangement is thermally insulated from the second support arrangement and wherein the wire bonding apparatus is suitable for wire bonding to electrically connect a first contact of the first integrated circuit package component to a second contact of the second integrated circuit package component.

* * * * *